(12) United States Patent
Lee et al.

(10) Patent No.: US 7,214,990 B1
(45) Date of Patent: May 8, 2007

(54) MEMORY CELL WITH REDUCED SOFT ERROR RATE

(75) Inventors: Shih-Ked Lee, Fremont, CA (US); Chuen-Der Lien, Los Altos Hills, CA (US); Louis Huang, San Jose, CA (US); Gaolong Jin, Hillsboro, OR (US); Wanqing Cao, Portland, OR (US); Guo-Qiang Lo, Singapore (SG)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 11/063,704

(22) Filed: Feb. 22, 2005

Related U.S. Application Data

(63) Continuation-in-part of application No. 10/805,718, filed on Mar. 22, 2004, now Pat. No. 7,078,306.

(60) Provisional application No. 60/457,071, filed on Mar. 24, 2003.

(51) Int. Cl.
    *H01L 27/11* (2006.01)
(52) U.S. Cl. ............... 257/369; 257/368; 257/E27.098; 257/E21.661
(58) Field of Classification Search ............... 257/369, 257/368, E27.098, E21.661
    See application file for complete search history.

(56) References Cited

U.S. PATENT DOCUMENTS

| | | | |
|---|---|---|---|
| 4,641,165 A | 2/1987 | Iizuka et al. | |
| 4,805,147 A | 2/1989 | Yamanaka et al. | |
| 4,864,539 A | 9/1989 | Chuang et al. | |
| 5,128,745 A | 7/1992 | Takasu et al. | |
| 5,324,982 A | 6/1994 | Nakazato et al. | |
| 5,710,070 A | 1/1998 | Chan | |
| 5,825,686 A | 10/1998 | Schmitt-Landsiedel et al. | |
| 5,905,290 A | * 5/1999 | Houston | 257/380 |
| 6,580,130 B1 | 6/2003 | Schoellkopf et al. | |
| 6,621,146 B1 | 9/2003 | Bowman | |
| 6,649,456 B1 | 11/2003 | Liaw | |
| 6,992,916 B2 | * 1/2006 | Liaw | 365/154 |

(Continued)

OTHER PUBLICATIONS

The Design of Radiation-Hardened ICs for Space: A Compendium of Approaches, S. Kern and B.D. Shafer, Proceedings of the IEEE, vol. 76, No. 11, pp. 1470-1509.

(Continued)

*Primary Examiner*—Evan Pert
*Assistant Examiner*—Victor A. Mandala, Jr.
(74) *Attorney, Agent, or Firm*—Glass & Associates

(57) ABSTRACT

The present invention includes SRAM memory cells and methods for forming SRAM cells having reduced soft error rate. The SRAM cell includes a first NMOS transistor and a first PMOS transistor having a common gate, and a second NMOS transistor and a second PMOS transistor having a common gate. A first resistor is electrically coupled on one end to the drains of the first PMOS transistor and the first NMOS transistor; and is electrically coupled on the other end to the common gate of the second NMOS and second PMOS transistors. A second resistor is electrically coupled on one end to the drains of the second PMOS transistor and the second NMOS transistor; and is electrically coupled on the other end to the common gate of the first NMOS transistor and the first PMOS transistor. The added resistor can be embedded in a contact opening such that it does not take up valuable surface area on the semiconductor substrate. Thereby, data loss from soft errors can be avoided while preserving small memory cell size.

11 Claims, 12 Drawing Sheets

U.S. PATENT DOCUMENTS

2002/0195661 A1    12/2002  Ueda
2003/0031040 A1*    2/2003  Hirano et al. ............... 365/100
2004/0150019 A1*    8/2004  Nakashima et al. ........ 257/296
2005/0180198 A1*    8/2005  Hayashi et al. ............. 365/154

OTHER PUBLICATIONS

A Proposed New Structure for SEU Immunity in SRAM Employing Drain Resistance, A. Ochoa, Jr et al, IEEE electron device letter No. 11, pp. 537-539, 1987.

Experimental Determination of Time Constants for Ion-Induced Transients in Static Memories, H. Weaver et al, IEEE transaction on electron devices vol. 35, No. 7, pp. 1116-1119, 1988.

A New Soft Error Immune Static Memory Cell, M. Minami et al, 1988 Symposium on VLSI Technology, pp. 57-58, 1988.

Soft Error Protection Using Asymmetric Response Latches, H. Weaver, IEEE transaction on electron devices vol. 38, No. 6, pp. 1555-1557, 1991.

* cited by examiner

MEMORY CELL WITH REDUCED SOFT ERROR RATE

This application is a continuation-in-part of application Ser. No. 10/805,718, entitled "Thin Film Resistor Structure and Method for Forming Thin Film Resistor Structure," by Gaolong Jin et al., filed on Mar. 22, 2004, now U.S. Pat. No. 7,078,306 which claims the priority of U.S. Provisional Application Ser. No. 60/457,071, filed Mar. 24, 2003. The disclosures of the above-described prior applications are incorporated herein by reference.

FIELD OF THE INVENTION

The present invention relates to the field of semiconductor devices. More specifically, the present invention relates to semiconductor devices and methods for forming semiconductor devices.

BACKGROUND ART

Soft errors in integrated circuit devices result from high energy particles that pass through semiconductor devices. Soft errors are particularly problematic in DRAM and SRAM devices as they can cause the memory cell to flip, corrupting the stored data. Most computer systems deal with soft errors using single-bit error correction algorithms that use error correction words to identify errors and fix the corrupted data. However, as device densities and die sizes increase, and as memory widths move to ×8, ×16 and wider memory devices, the likelihood of multiple-bit errors increases. The single-bit error correction algorithms that are currently used may not be able to correct these multiple-bit errors, resulting in lost data and potentially causing system failure.

Accordingly, there is a need for a method and apparatus that reduce the occurrence of soft errors in memory cells. In addition, there is a need for a DRAM cell and a SRAM cell that have high soft error tolerance. The method and apparatus of the present invention meets the above needs.

DISCLOSURE OF THE INVENTION

The present invention provides a DRAM cell, a Static Random Access Memory (SRAM) cell and a method for forming a memory cell having high soft error tolerance. The SRAM cell and DRAM cells of the present invention include resistors that reduce the soft error rate in the memory cell.

A SRAM cell is disclosed that includes a first NMOS transistor and a first PMOS transistor having a common gate, and a second NMOS transistor and a second PMOS transistor having a common gate. A first resistor is electrically coupled on one end to the drains of the first PMOS transistor and the first NMOS transistor; and is electrically coupled on the other end to the common gate of the second NMOS and second PMOS transistors. A second resistor is electrically coupled on one end to the drains of the second PMOS transistor and the second NMOS transistor; and is electrically coupled on the other end to the common gate of the first NMOS transistor and the second PMOS transistor. The addition of a resistor to the SRAM cell of the present invention increases the RC time constant of the SRAM cell. When high speed particles strike a drain of a transistor in the SRAM cell, though the impact may change the NMOS drain voltage to flip from a HIGH (1) state to a LOW (0) state or PMOS drain voltage from a LOW state to a HIGH state, the voltages at the common gates will not change state from HIGH to LOW or from LOW to HIGH. Thereby switching of transistors in the SRAM cell is prevented and data loss is avoided.

A DRAM cell is disclosed that includes a NMOS transistor, a capacitor and a resistor that is electrically coupled on one end to the capacitor and is electrically coupled on the other end to the drain of the NMOS transistor.

The resistor used in the SRAM cell and the DRAM cell of the present invention can be a thin film resistor that is patterned at the same time as the first metal layer, or a thin film resistor that is patterned prior to the deposition of the first metal layer. In another embodiment the resistor extends through an opening in the pre-metal dielectric layer and electrically couples to an overlying interconnect through a contact that extends above the resistor. Alternatively, the resistor can extend above the contact, with the contact electrically coupling the resistor to the underlying conductive line or gate.

The addition of a resistor to the DRAM cell of the present invention increases the RC time constant of the DRAM cell. When high speed particles strike a drain of a transistor in the DRAM cell, the resulting current flow rate is reduced, allowing the cell to be refreshed before the data in the cell is lost.

These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should be understood as not being drawn to scale except if specifically noted.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
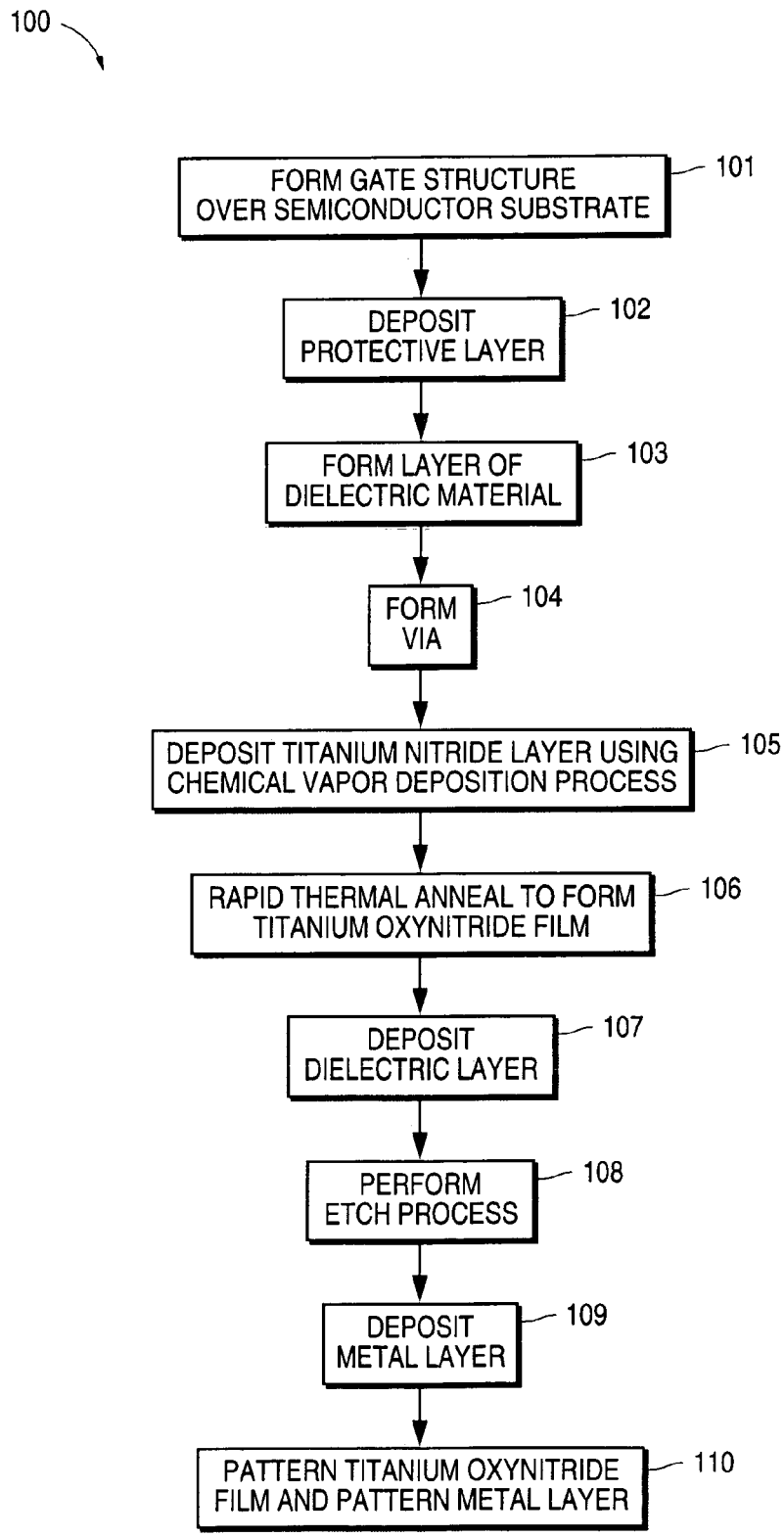
FIG. 1 is a flow chart that illustrates a method for forming a thin film resistor on a semiconductor substrate in accordance with one embodiment of the present invention.

FIG. 1 illustrates a method 100 for forming a thin film resistor on a semiconductor substrate. As shown by step 101 a gate structure is formed over a semiconductor substrate. In the embodiment shown in FIG. 2, the gate structure 10 includes gate oxide layer 4, polysilicon layer 5, and conductive layer 6. Gate structure 10 also includes silicon oxynitride layer 7 and silicon nitride layer 8 which overlie conductive layer 6. Gate structure 10 also includes spacers 9 disposed on the sides of gate structure 10.

Figure 2:
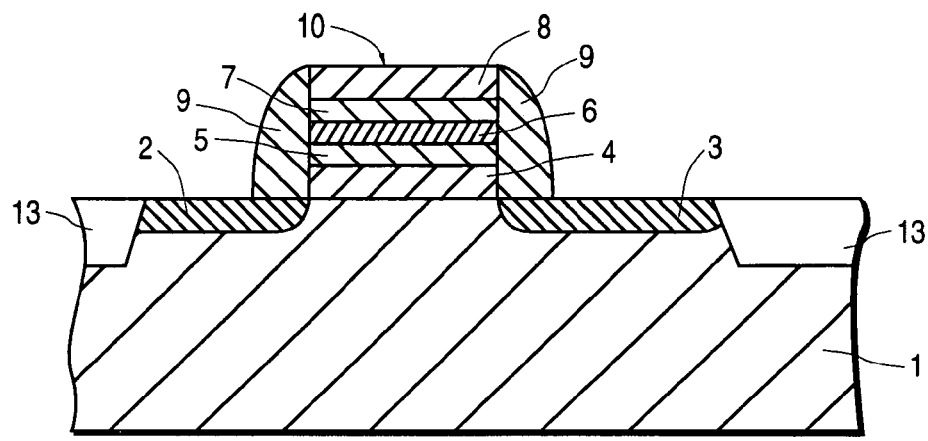
FIG. 2 is a side cross-sectional view of a portion of a semiconductor substrate over which source, drain and gate structures have been formed in accordance with one embodiment of the present invention.

FIG. 2 shows an embodiment in which a gate structure 10 is formed over a semiconductor substrate 1 that includes dielectric-filled trenches 13 that isolate portions of semiconductor substrate 1. A portion of gate structure 10 extends between source 2 and drain 3.

In the present embodiment, conductive layer 6 is tungsten silicide. However, it is appreciated that other conductive materials could also be used. Also, though the gate structure of the present invention is shown to include layers 4–8 it is appreciated that gate structure 10 could include more or fewer layers. For example, a gate structure could be formed that does not include protective layers 7–8. Alternatively, a gate structure could be used that includes additional protective layers. In addition, spacers 9 could include more layers (e.g., an underlying oxide layer).

Figure 3:
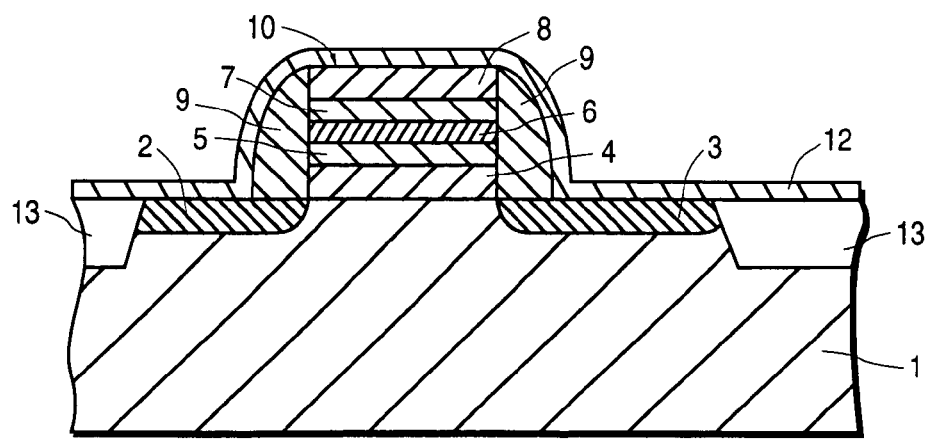
FIG. 3 is a side cross-sectional view of the structure of FIG. 2 after a protective layer has been deposited thereover in accordance with one embodiment of the present invention.

As shown by step 102, a protective layer is deposited. This protective layer protects the underlying structures during subsequent process steps. FIG. 3 shows an embodiment in which protective layer 12 is formed over substrate 1. Protective layer 12 overlies gate structure 10 and overlies the top surface of semiconductor substrate 1. In one embodiment, protective layer 12 is a layer of silicon nitride ($Si_3N_4$). Alternatively, protective layer 12 is silicon oxynitride ($Si_xN_yO_z$).

Though method 100 includes the deposition of a protective layer in step 102 it is appreciated that the present invention could be practiced without the use of a protective layer 12. Also, the protective layer deposited in step 102 could include the deposition of multiple protective layers.

A layer of dielectric material is formed as shown by step 103 of FIG. 1. In the present embodiment the dielectric layer includes both tetraethylorthosilane (TEOS) and borophosphosilicate glass (BPSG). However, it is appreciated that other dielectric materials could also be used.

Figure 4:
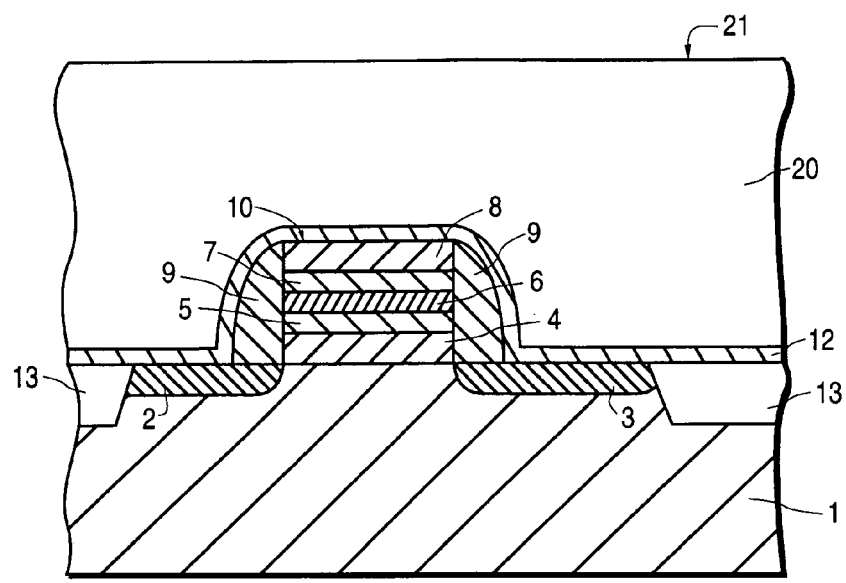
FIG. 4 is a side cross-sectional view of the structure of FIG. 3 after a layer of borophosphosilicate glass (BPSG) has been deposited and planarized using a chemical mechanical polishing process, and after a layer of tetraethylorthosilane (TEOS) has been deposited so as to form a layer of dielectric material having a planar top surface in accordance with one embodiment of the present invention.

In the embodiment illustrated in FIG. 4, a dielectric layer 20 is shown that is formed using both BPSG and TEOS. In this embodiment a layer of BPSG is deposited such that the BPSG layer directly overlies protective layer 12. The layer of BPSG is then planarized using a chemical mechanical polishing process to give a layer of BPSG having a thickness of approximately 6 kA (thousand Angstroms) from the substrate surface. A layer of TEOS is then deposited over the planarized BPSG layer, forming a dielectric layer 20 that has a planar top surface 21. In one embodiment, the layer of TEOS has a thickness of approximately 1 kÅ, giving a dielectric layer 20 that is approximately 7 kÅ thick.

Figure 5:
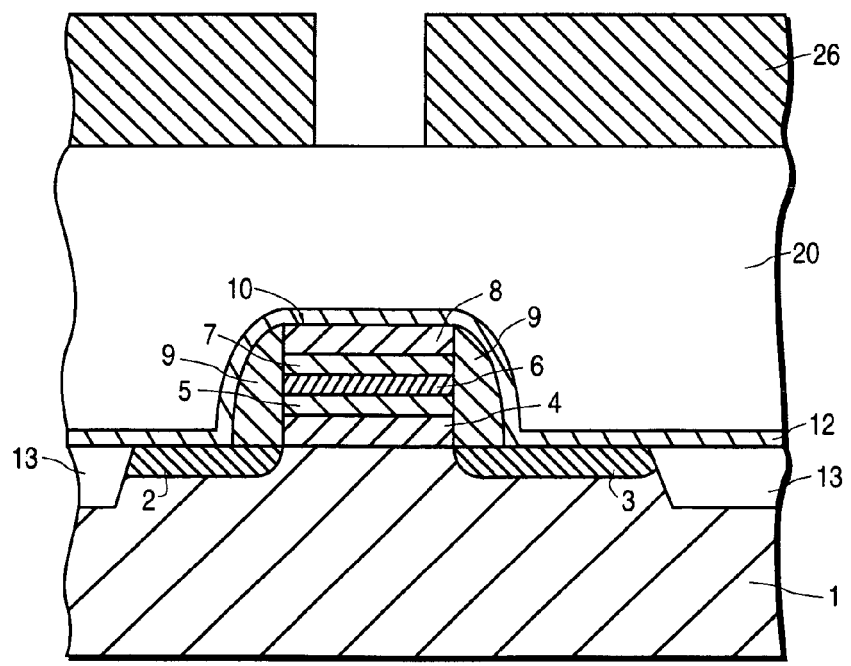
FIG. 5 is a side cross-sectional view of the structure of FIG. 4 after a photoresist masking structure has been formed thereover in accordance with one embodiment of the present invention.
Figure 6:
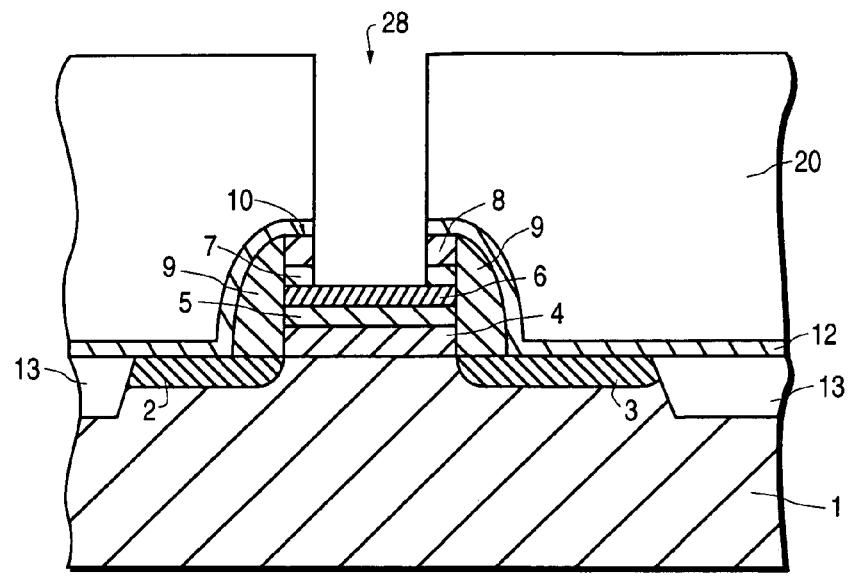
FIG. 6 is a side cross-sectional view of the structure of FIG. 5 after an etch step has been performed so as to etch an opening that extends through the dielectric layer and through the layer of silicon nitride in accordance with one embodiment of the present invention.
Figure 7:
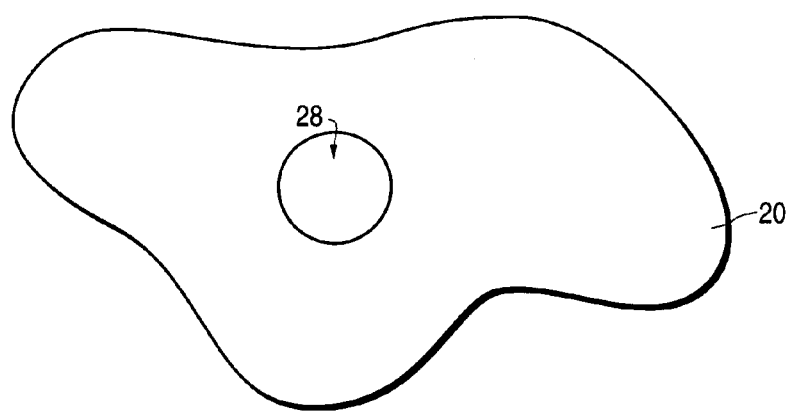
FIG. 7 is top view of the structure of FIG. 6 in accordance with one embodiment of the present invention.

A via is formed as shown by step 104 of FIG. 1. More particularly, an opening is formed that extends through the layer of dielectric material 20 and through layer of silicon nitride 12. FIGS. 5–6 illustrate an embodiment in which a via 28 is formed by depositing, exposing and developing a layer of photoresist material to form a photoresist masking structure 26. An etch step is then performed to form an opening 28 that extends through dielectric layer 20 and through protective layer 12 so as to expose a portion of gate structure 10. In the present embodiment, opening 28 also extends through layers 7–8 of gate structure 10, exposing a portion of conductive layer 6. The photoresist masking structure 26 is then removed using a conventional photoresist strip process to form the structure shown in FIGS. 6–7.

Referring now to step 105 of FIG. 1, a layer of titanium nitride (TiN) is deposited using a chemical vapor deposition process. The use of a chemical vapor deposition process gives a layer of titanium nitride having better uniformity and better conformality than can be obtained using evaporation or sputtering methods.

In one embodiment the titanium nitride is deposited in an environment that includes titanium tetrachloride gas ($TiCl_4$) ambient. In yet another embodiment a Metal Organic Chemical Vapor Deposition (MOCVD) process is used to form a titanium nitride layer. The MOCVD process can use either a tetrakis (dimethyl-amino) titanium (TDMAT) or a tetrakis (diethylamino) titanium (TDEAT) organometallic source.

Figure 8:
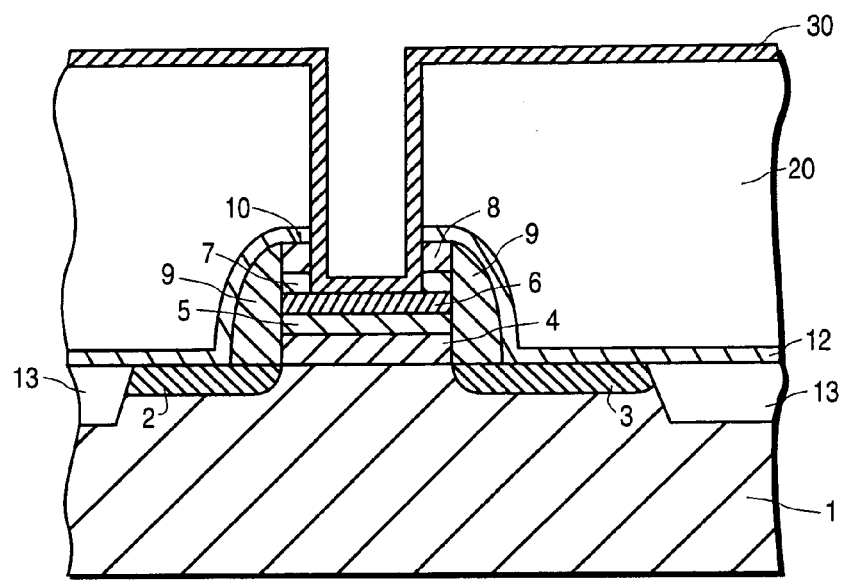
FIG. 8 is a side cross-sectional view of the structure of FIG. 6 after a layer of titanium nitride has been deposited thereover using a chemical vapor deposition process in accordance with one embodiment of the present invention.

FIG. 8 shows a titanium nitride layer 30 formed in accordance with step 105 of FIG. 1. In the present embodiment titanium nitride layer 30 has a thickness that is less than the diameter of opening 28 such that titanium nitride layer 30 only partially fills opening 28. In one embodiment opening 28 has a diameter of approximately 0.2 μm and titanium nitride layer 30 has a thickness of approximately 100–200 Angstroms such that only a portion of opening 28 is filled by titanium nitride layer 30.

Titanium nitride layer 30 extends within opening 28 such a portion of titanium nitride layer 30 directly overlies conductive layer 6. Another portion of titanium nitride layer 30 extends along the sidewalls of opening 28, conforming to the shape of opening 28. These two portions of titanium nitride layer 30 partially fill opening 28. A third portion of layer of titanium nitride layer 30 extends over top surface 21 of dielectric layer 20.

In the present embodiment, because opening 28 is round, that portion of titanium nitride layer 30 that extends along the sidewalls of opening 28 is cylindrical. As the portion of titanium nitride layer 30 that directly overlies conductive layer 6 extends horizontally, these two portions of titanium nitride layer 30 form a cylindrical shape that is closed at the bottom and open at the top.

In one embodiment the CVD titanium nitride film is treated with plasma bombardment after deposition to form a bilayer structure that includes a treated layer on top and untreated layer on the bottom. The treated layer provides high quality film with better conductivity. In another embodiment a multilayer structure of CVD titanium nitride film (without plasma treatment) is used to form a multilayer structure. The multilayer structure includes an alternate untreated layer and a treated layer.

Referring now to step 106 of FIG. 1, a rapid thermal anneal is performed in an oxygen ambient. The rapid thermal anneal of step 106 incorporates oxygen into the titanium nitride, forming titanium oxynitride film 30a.

In the present embodiment the thin titanium nitride film is annealed in an oxygen environment that also includes a carrier gas such as, for example, nitrogen. In the present embodiment a temperature of from 400 to 500 degrees centigrade is used.

The anneal process significantly increases the resistivity of the titanium nitride layer. For example, a typical resistivity of the titanium nitride layer is in the range of from 100 to 500 Ohms/square for a thickness of 100 A. By performing a rapid thermal anneal in an oxygen ambient this resistivity can be raised to a resistivity of from $5\times10^{-4}$ Ω·cm (as-deposited) to a resistivity of 1 Ω·cm (e.g., using a rapid thermal anneal of 450° C.) or higher.

In one specific embodiment, a temperature 425 degrees centigrade is used in a rapid thermal anneal process in which the wafer is heated for a time of 20 seconds. In this embodiment a flow of 0.3 standard liters per minute of oxygen gas and nitrogen gas (using a ration of 1 $O_2$/10 $N_2$) is introduced into the chamber used to perform the rapid thermal anneal process. This has been found to increase the resistivity of titanium nitride layer 30 from an initial resistivity of $6\times10^{-4}$ Ω·cm to a resistivity of approximately $8.65\times10^{-3}$ Ω·cm.

In another embodiment, a temperature 450 degrees centigrade is used in a rapid thermal anneal process in which the wafer is heated for a time of 15 seconds. In this embodiment a flow of 0.3 standard liters per minute of oxygen gas and nitrogen gas (using a ration of 1 $O_2$/10 $N_2$) is introduced into the chamber used to perform the rapid thermal anneal process. This has been found to increase the resistivity of titanium nitride layer 30 from an initial resistivity of $6\times10^{-4}$ Ω·cm to a resistivity of approximately $2.1\times10^{-2}$ Ω·cm.

In another embodiment, a temperature 450 degrees centigrade is used in a rapid thermal anneal process in which the wafer is heated for a time of 20 seconds. In this embodiment a flow of 0.3 standard liters per minute of oxygen gas and nitrogen gas (using a ration of 1 $O_2$/10 $N_2$) is introduced into the chamber used to perform the rapid thermal anneal process. This has been found to increase the resistivity of titanium nitride layer 30 from an initial resistivity of $6\times10^{-4}$ Ω·cm to a resistivity of approximately $4.8\times10^{-2}$ Ω·cm.

In another embodiment a temperature 500 degrees centigrade is used in a rapid thermal anneal process in which the wafer is heated for a time of 20 seconds. In this embodiment a flow of 0.3 standard liters per minute of oxygen gas and nitrogen gas (using a ration of 1 $O_2$/10 $N_2$) is introduced into the chamber, producing a resistivity of greater than $5\times10^{-1}$ Ω·cm.

The film resistivity increases monotonously with the anneal temperature and time, Therefore, a resistor can be obtained having a desirable resistivity by adjusting the anneal conditions.

The use of an anneal temperature of less than five hundred degrees is desirable in that thermal budget issues are avoided. More particularly, because the anneal temperature is so low, it does not have any significant negative thermal impact on the fabrication process.

The rapid thermal anneal of step 106 significantly improves the resistance stability of the resulting titanium oxynitride film. Titanium nitride films (deposited using a chemical vapor deposition process) that have not been annealed can have a change in resistance of as much as eighteen percent ($\delta R/R_0$) in 113 hours (where $\delta R$ is the change in resistance and where $R_0$ is the initial resistance). However, it has been found that when the rapid thermal anneal of step 106 is performed, the change in resistance is less than one percent ($\delta R/R_0$) after 113 hours. Accordingly, the present invention has better resistance stability as compared to the resistance stability of prior art titanium nitride films that have not been annealed using the rapid thermal anneal process of the present invention.

As shown by steps 107–108 of FIG. 1, the remaining portion of the via is filled with dielectric material. In the present embodiment, a layer of dielectric material is deposited as shown by step 107. In one embodiment the dielectric material is SOG (Spin on Glass) oxide that is spin-coated onto the wafer. However, it is appreciated that other dielectric materials could also be used.

Figure 9:
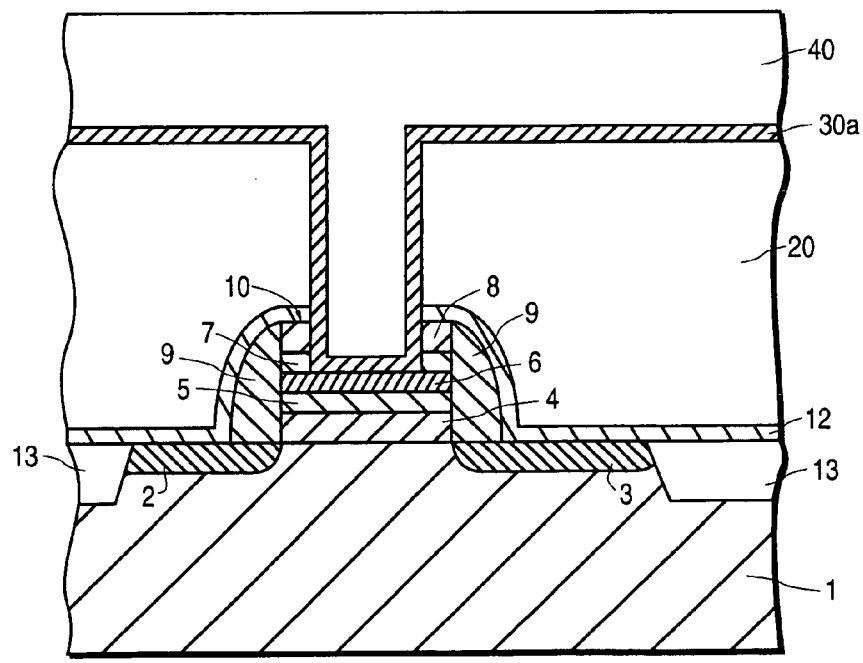
FIG. 9 is a side cross-sectional view of the structure of FIG. 8 after a rapid thermal anneal has been performed in an oxygen ambient and after a layer of dielectric has been deposited thereover in accordance with one embodiment of the present invention.

In the embodiment shown in FIG. 9 layer of dielectric material 40 is shown to be deposited such that it fills the remaining portion of opening 28. More particularly, layer of dielectric material 40 fills that portion of opening 28 that is not filled by titanium oxynitride film 30a.

Figure 10:
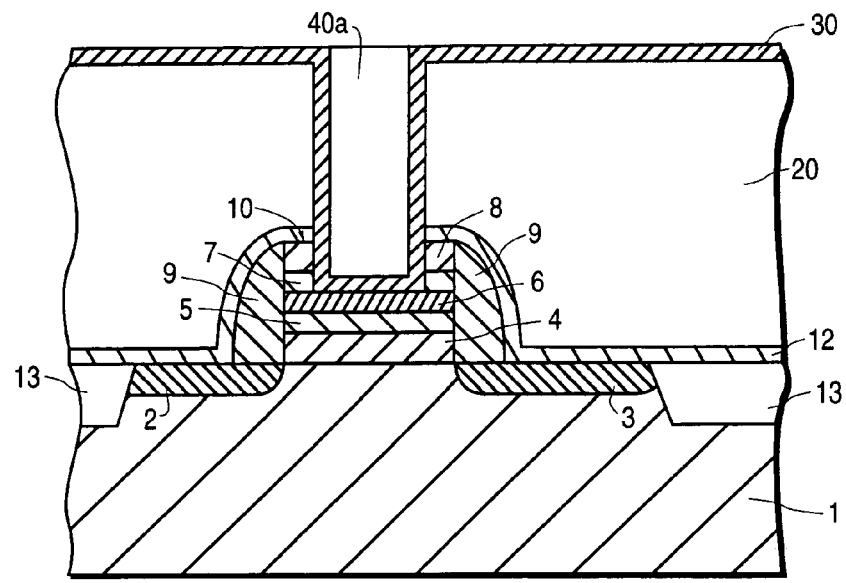
FIG. 10 is a side cross-sectional view of the structure of FIG. 9 after an etch has been performed so as to form a dielectric plug in accordance with one embodiment of the present invention.

An etch process is performed as shown by step 108 of FIG. 1 to etch-back a portion of layer of dielectric material 40. More particularly, that portion of layer of dielectric material 40 is etched that overlies the portion of titanium oxynitride film 30a that extends over the top surface 21 of dielectric layer 20. This leaves a dielectric plug 40a shown in FIG. 10 that fills the remainder of opening 28.

Figure 11:
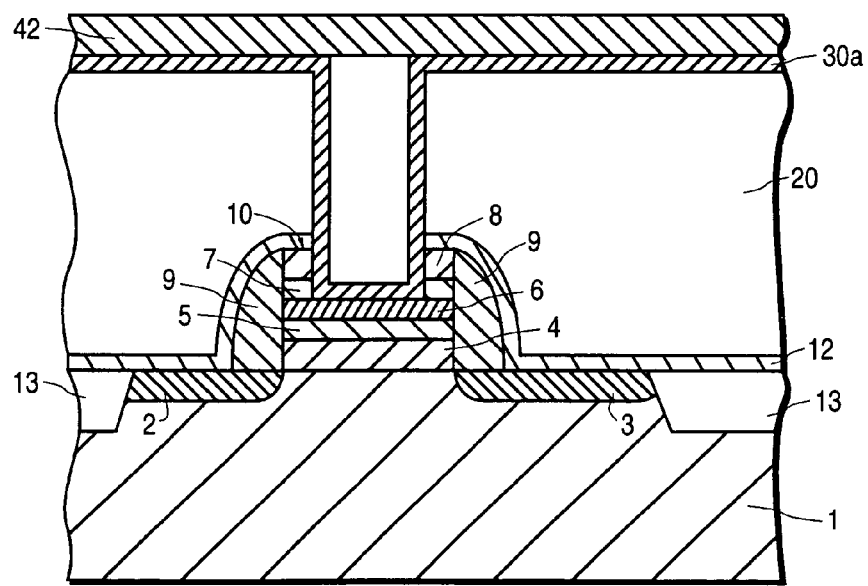
FIG. 11 is a side cross-sectional view of the structure of FIG. 10 after a layer of metal has been deposited thereover in accordance with one embodiment of the present invention.

A metal layer is then deposited as shown by step 109 of FIG. 1. In one embodiment, a Physical Vapor Deposition (PVD) process is used to deposit a layer of titanium nitride. FIG. 11 illustrates an embodiment in which metal layer 42 is deposited over semiconductor substrate 1.

As shown by step 110 the titanium oxynitride film and the metal layer are patterned. In the present embodiment the titanium oxynitride film and the metal layer are simultaneously patterned. More particularly, mask and etch steps are performed after deposition of metal layer 42 to simultaneously pattern titanium oxynitride film 30a and metal layer 42.

Figure 12:
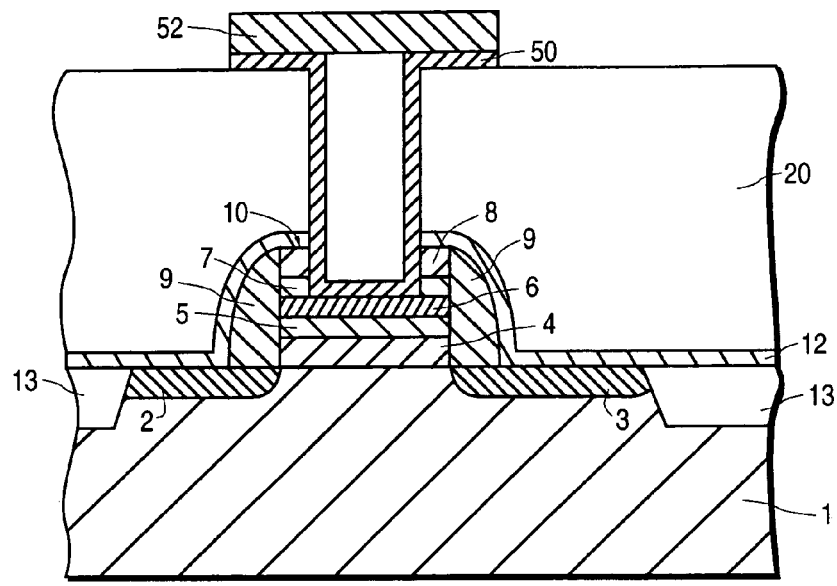
FIG. 12 is a side cross-sectional view of the structure of FIG. 11 after the titanium oxynitride film and the metal layer have been patterned so as to form a titanium oxynitride structure and an interconnect structure in accordance with one embodiment of the present invention.

In the embodiment illustrated in FIG. 12, step 110 is performed by depositing (coating), exposing, and developing a layer of photoresist material to form a masking structure. That portion of titanium oxynitride film 30a and metal layer 42 that are not covered by the overlying masking structure are then etched, simultaneously forming titanium oxynitride structure 50 and forming metal interconnect structure 52. Interconnect structure 52 is electrically coupled to titanium oxynitride structure 50 and electrically couples titanium oxynitride structure 50 to other circuitry on semiconductor substrate 1.

In an alternate embodiment the titanium oxynitride film and the metal layer are separately patterned. In this embodiment the titanium oxynitride film is patterned by performing mask and etch steps to complete the titanium oxynitride structure prior to depositing the metal layer (step 109) that is to be used as an interconnect. The metal layer is then patterned, forming an interconnect structure that at least partially overlies the titanium oxynitride structure. Though this embodiment adds additional process steps, an interconnect can be obtained that has a shape that is different from the shape of the resistor structure.

In one embodiment, a thin film resistor formed in accordance with method 100 of FIG. 1 is used to form mixed-mode integrated circuit devices such as analog devices. However, the methods and apparatus of the present invention not limited to these types of integrated circuit devices.

Though FIGS. 1–12 illustrate an embodiment in which the resistor couples to a gate, alternatively the resistor could couple to other structures. In one alternate embodiment the resistor couples to an underlying metal interconnect. In another embodiment the resistor couples to a source region or to a drain region. Alternatively, multiple resistors can be used that couple to each of a gate, a source, and a drain.

The thin film resistor of the present invention has good resistance stability. It has been found the resistance of the thin film resistor of the present invention does not significantly change after being stored in a fabrication environment for five days. This is a significant improvement as compared to a titanium nitride film (deposited using a chemical vapor deposition process) that has not been annealed using the rapid thermal anneal process of step 106 (which will have a resistance that will continue to increase steadily over time).

Figure 13:
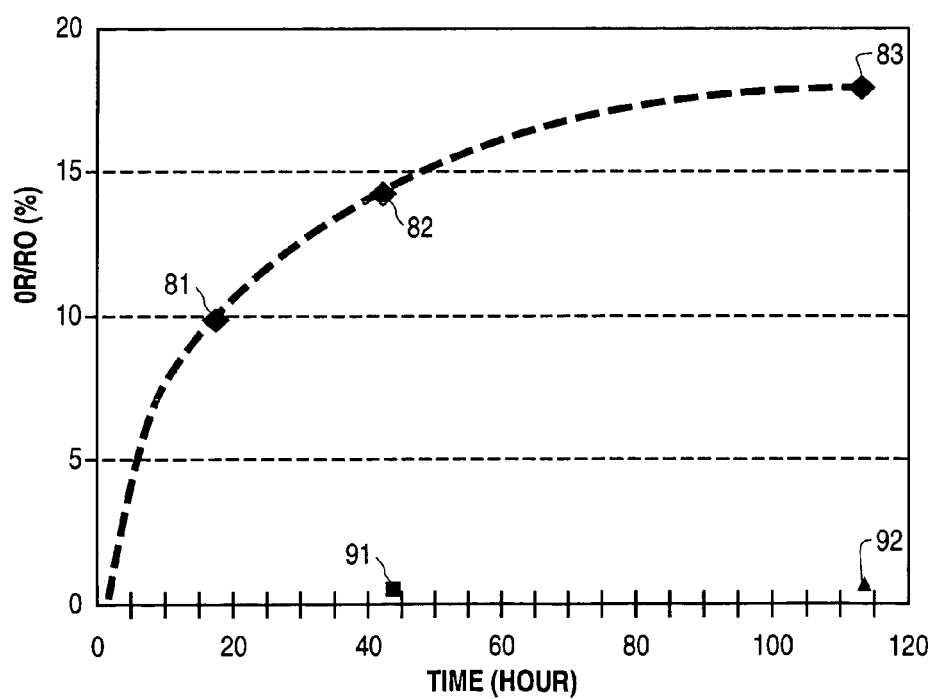
FIG. 13 is a graph that illustrates changes in resistance over time for an as-deposited titanium nitride film, for a titanium nitride film that has been annealed using a rapid thermal anneal process in an oxygen ambient at 425 degrees centigrade and for a titanium nitride film that has been annealed using a rapid thermal anneal process in an oxygen ambient at 450 degrees centigrade in accordance with one embodiment of the present invention.

FIG. 13 shows points 81–83 which represent the change of resistance over time for an as-deposited titanium nitride film. It can be seen that the resistance significantly increases over time. In contrast, the resistance of a CVD titanium nitride film that has been annealed using a rapid thermal anneal process in an oxygen ambient at 425 degrees centigrade, illustrated by point 91, does not significantly increase over time. Similarly, the resistance of a CVD titanium nitride film that has been annealed using a rapid thermal anneal process in an oxygen ambient at 450 degrees centigrade, illustrated by point 92, does not significantly increase over time.

The resistivity of titanium oxynitride structure 50 can be varied within a wide range of resistivity to meet the needs of a particular application. More particularly, a titanium oxynitride structure 50 can be formed having a resistance of from approximately 100 to $10^6$ Ohms/square with a thickness of approximately 100 Angstrom and square pattern (length equals to width). This is a significantly wider range than can be obtained from other metallic thin film resistors such as Chromium-based films (which have a range of from $10^3$ to $10^4$ ohms/square).

Moreover, in applications where a high resistivity is needed, the methods of the present invention allow for forming a thin film resistor having a desired high resistance with excellent stability. Also the methods and structure of the present invention provide a resistor structure that takes up less real estate on the semiconductor wafer, allowing the design to meet the requirement of the scaling technology. Also, because titanium nitride is commonly used in standard VLSI semiconductor fabrication processes, the methods of the present invention are easily integrated into current fabrication processes. Also, the thin film resistor of the present invention has good resistance stability irrespective of the subsequent process flow (i.e., thermal cycles, ambient, etc.).

Figure 14:
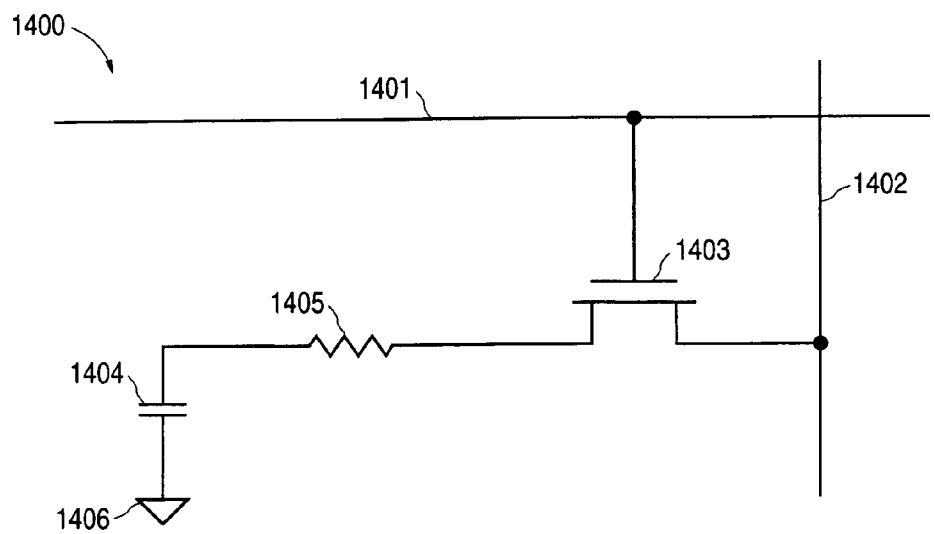
FIG. 14 is a diagram of a DRAM cell having high soft error tolerance in accordance with one embodiment of the present invention.
Figure 15:
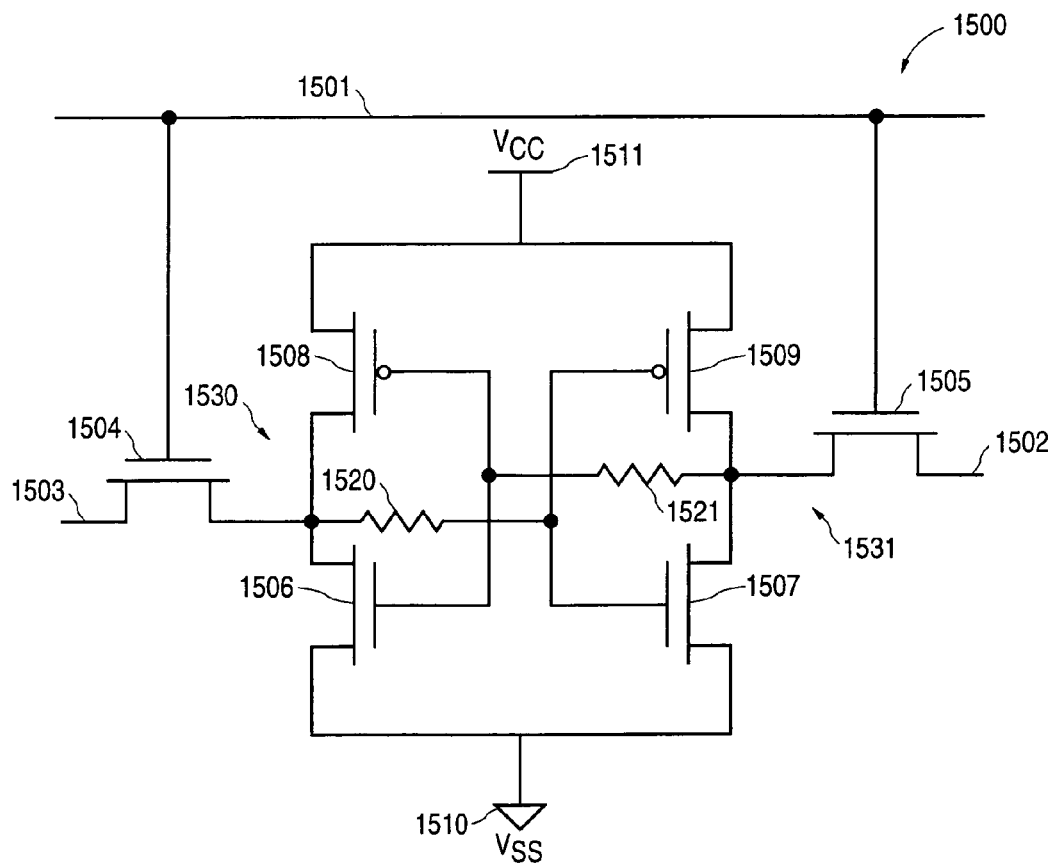
FIG. 15 is a diagram of a SRAM cell having high soft error tolerance in accordance with one embodiment of the present invention.

FIGS. 14–15 illustrate CMOS memory cells formed in accordance with embodiments of the present invention. Now referring to FIG. 14, a DRAM memory cell 1400 is shown that has a reduced soft error rate. In the present embodiment DRAM memory cell 1400 includes a single NMOS transistor 1403. The source of NMOS transistor 1403 is electrically coupled to bit line 1402 and the gate of NMOS transistor 1403 is electrically coupled to word line 1401. Resistor 1405 is electrically coupled on one end to the drain of NMOS transistor 1403 and the other end of resistor 1405 is electrically coupled to storage capacitor 1404. Storage capacitor 1404 is coupled to ground/power node 1406, and is operable to store electrical charge received from bit line 1402.

The addition of resistor 1405 to DRAM cell 1400 increases the RC time constant of DRAM cell 1400. When high speed particles strike the drain of transistor 1403, the resulting current flow rate is reduced, allowing the cell to be refreshed before the data in the cell is lost.

In the present embodiment resistor 1405 has a resistance sufficient to delay the discharge for a sufficient time period that storage capacitor 1404 will be refreshed prior to loss of data in DRAM cell 1400. In one embodiment, resistor 1405 is formed in accordance with the embodiments shown in FIGS. 1–12 such that resistor 1405 is the same as resistor 50 shown in FIG. 12. In this embodiment the charge storage region (not shown) of capacitor 1404 is located below gate structure 10, and is electrically coupled to gate structure 10 such that the charge stored in capacitor 1404 couples to the drain of NMOS transistor 1403 via resistor 50, interconnect 52 and a contact (not shown) that extends from interconnect 52 to the drain of NMOS transistor 1403. Though structure 10 is referred to as a gate structure in FIGS. 1–12, it is appreciated that, in DRAM cell 1400, structure 10 does not function as a transistor gate. Rather, structure 10 is a conductive line that couples to a storage capacitor 1404. Moreover, gate structure 10 could be formed of any of a number of different materials. In one embodiment gate structure 10 includes a first polysilicon layer, an insulator layer and a second polysilicon layer that immediately overlies the insulator layer.

In the present embodiment resistor 1405 extends above gate structure 10, the resulting DRAM cell (FIG. 14) does not take up any additional surface area of semiconductor substrate 1 as compared to prior art DRAM cells. Accordingly, the methods and apparatus of the present invention provide a DRAM cell having reduced soft error rates that does not take up any additional surface area as compared to prior art DRAM cells.

Now referring to FIG. 15, an SRAM memory cell 1500 is shown that has a reduced soft error rate. In the present embodiment SRAM memory cell 1500 has a voltage supply ($V_{CC}$) 1511 and an electrical ground ($V_{SS}$) 1510. SRAM memory cell 1500 includes NMOS transistor 1506 that is coupled to PMOS transistor 1508 so as to form a first inverter 1530. Similarly NMOS transistor 1507 is coupled to PMOS transistor 1509 so as to form a second inverter 1531.

A resistor 1520 is electrically coupled to the output of inverter 1530 and is electrically coupled to the input of inverter 1531. In the present embodiment resistor 1520 is electrically coupled on one end to the common drain of NMOS transistor 1506 and PMOS transistor 1508 and is electrically coupled on the other end to the common gate of PMOS transistor 1509 and NMOS transistor 1507. The drain of NMOS transistor 1506 and PMOS transistor 1508 are also electrically coupled to the drain of NMOS transistor 1504. The source of NMOS transistor 1504 is electrically coupled to bit line 1503 and the gate of NMOS transistor 1504 is electrically coupled to word line 1501.

A resistor 1521 is electrically coupled to the output of inverter 1531 and is electrically coupled to the input of inverter 1530. In the present embodiment resistor 1521 is electrically coupled on one end to the common drain of NMOS transistor 1507 and PMOS transistor 1509 and is electrically coupled on the other end to the common gate of PMOS transistor 1508 and NMOS transistor 1506. The common gate of inverter 1531 is electrically coupled to the drain of NMOS transistor 1505. The source of NMOS transistor 1505 is electrically coupled to bit bar line 1502 and the gate of NMOS transistor 1505 is electrically coupled to word line 1501.

Though the present embodiment includes both common drains and common gates for inverters 1530–1531 it is appreciated that, alternatively, the gates and/or the drains of transistors 1506–1509 could be separated.

In the present embodiment resistors 1520–1521 each have a resistance sufficient to prevent triggering of the transistors 1506–1509 upon impact of a high speed particle through the drain of one or more of transistors 1506–1509. The addition of resistors 1520–1521 to SRAM cell 1500 increases the RC time constant of SRAM cell 1500. In one embodiment the RC time constant is increased to a level that is smaller than the circuit RC and that is greater than the funneling RC of the integrated circuit device. In one specific embodiment the RC time constant is increased to a level that is between 500 pico seconds and 5 nano seconds. When high speed particles strike a drain of a transistor 1506–1509, though the impact may change the NMOS drain voltage to flip from a HIGH (1) state to a LOW (0) state or PMOS drain voltage from a LOW state to a HIGH state, the voltages at the common gates will not change state from HIGH to LOW or from LOW to HIGH. Thereby switching of transistors in the SRAM cell is prevented and data loss is avoided.

In one embodiment, resistors 1520–1521 are formed in accordance with the embodiments shown in FIGS. 1–13 to produce thin film resistors 1520–1521 that are identical to resistor 50 shown in FIG. 12. This produces thin film resistors 1520–1521 having high resistivity and good resistance stability.

Figure 16:
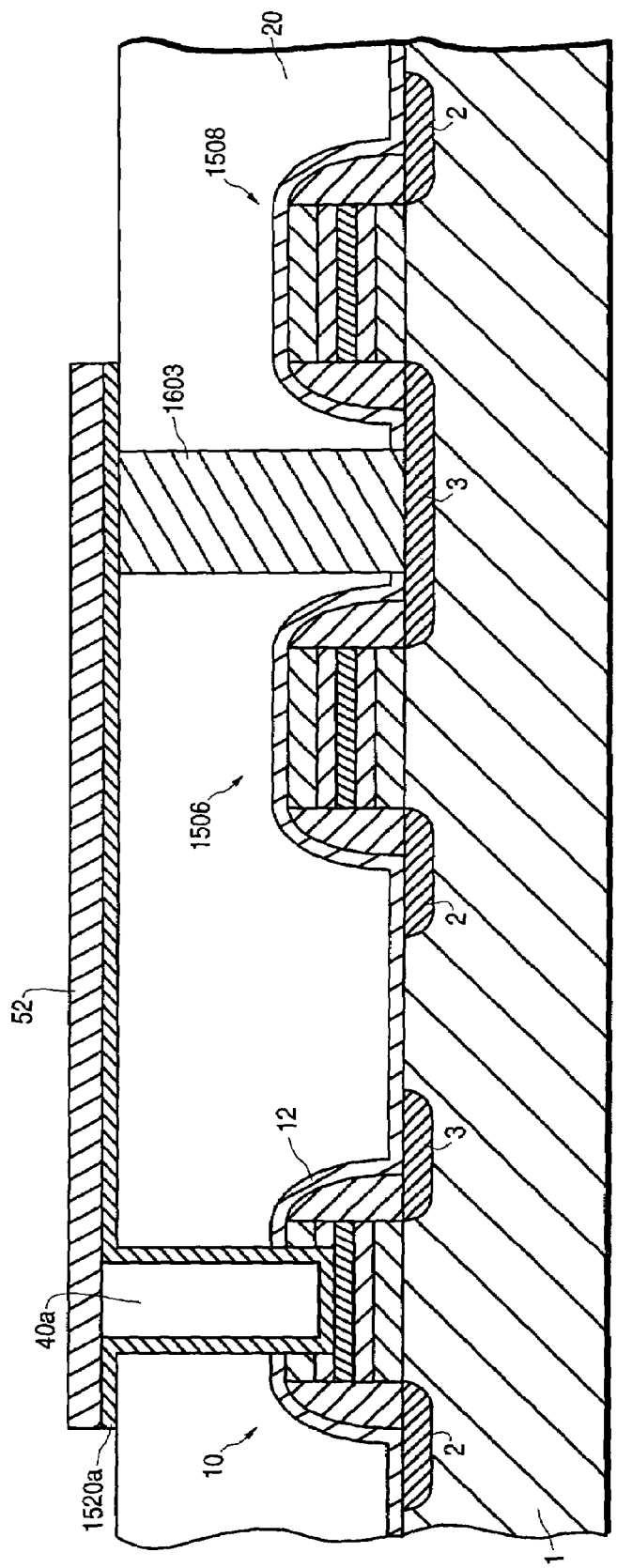
FIG. 16 is a side cross-sectional view of a portion of a SRAM memory cell that includes a thin film resistor formed using method 100 of FIG. 1 in accordance with one embodiment of the present invention.

In the embodiment shown in FIG. 16 a thin film resistor 1520*a* is formed using method 100 of FIG. 1. The bottom surface of thin film resistor 1520*a* contacts gate structure 10 and the top surface of thin film resistor 1520*a* contacts interconnect 52. In this embodiment gate structure 10 is the common gate that couples the gates of transistors 1507 and 1509. A contact 1603 that extends through pre-metal dielectric layer 20 electrically couples to interconnect 52 through that portion of resistor 1520*a* that overlies contact 1603. The other end of contact 1603 contacts the common drain of transistors 1506 and 1508, electrically coupling the common drain of transistors 1506 and 1508 to thin film resistor 1520*a*. An identical structure (not shown) that includes a resistor 1521 that is identical to resistor 1520 is used to provide resistance between the common gate of transistors 1506 and 1508 and the drain of transistors 1507 and 1509.

Figure 17:
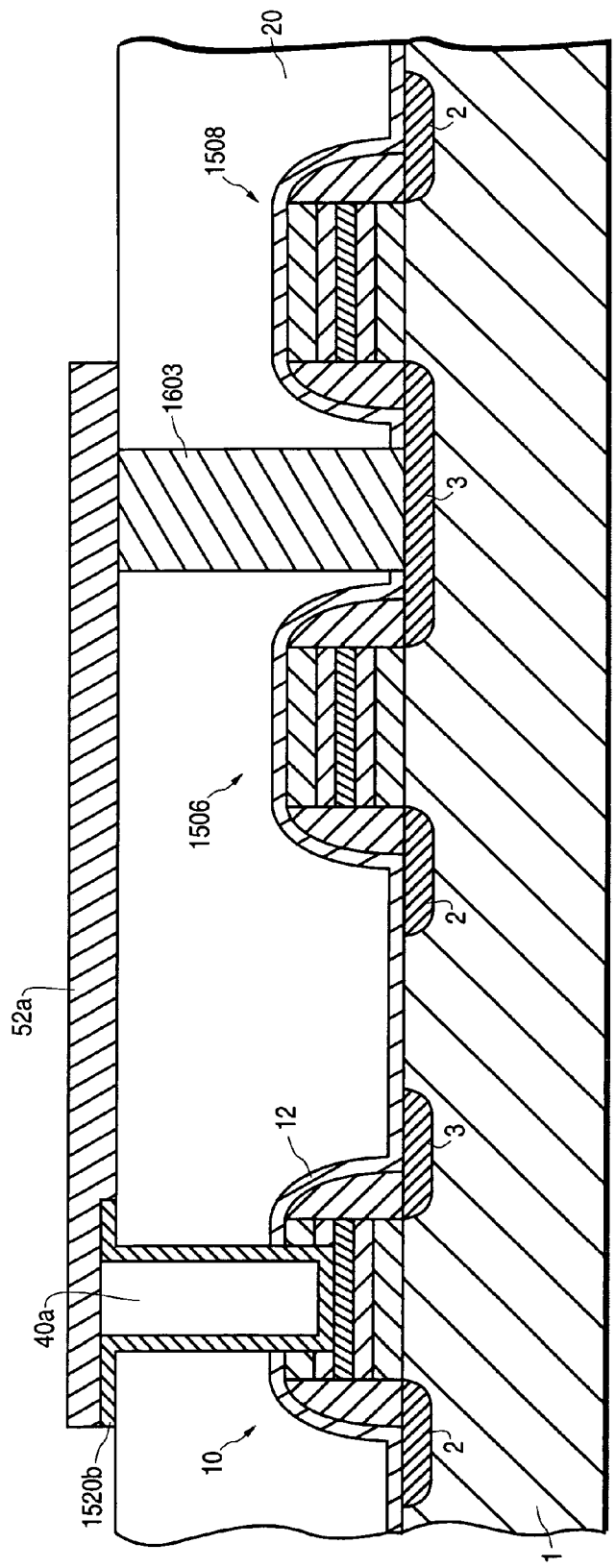
FIG. 17 is a side cross-sectional view of a portion of a memory cell that includes a thin film resistor having an upper surface that is patterned prior to patterning the overlying metal layer in accordance with one embodiment of the present invention.

In an alternate embodiment that is illustrated in FIG. 17, resistors 1520–1521 are formed in accordance with the methods of FIGS. 1–12 except that resistors 1520–1521 are patterned prior to depositing first metal layer 42 so as to form a thin film resistor 1520–1521 having an upper surface that does not have the same pattern as the overlying interconnect 52*a*.

Referring now to FIG. 17, thin film resistor 1520*b* is shown that has an upper surface that only extends a short distance from the sides of the opening in pre-metal dielectric layer 20. The bottom surface of thin film resistor 1520*b* contacts gate structure 10 and the top surface of thin film resistor 1520*b* contacts interconnect 52*a*. In this embodiment gate structure 10 is the common gate for transistors 1507 and 1509. Contact 1603 electrically couples interconnect 52*a* to the common drain of transistors 1506 and 1508. An identical structure (not shown) that includes a resistor 1521 that is identical to resistor 1520*b* is used to provide resistance between the common gate of transistors 1506 and 1508 and the drain of transistors 1507 and 1509.

Figure 18:
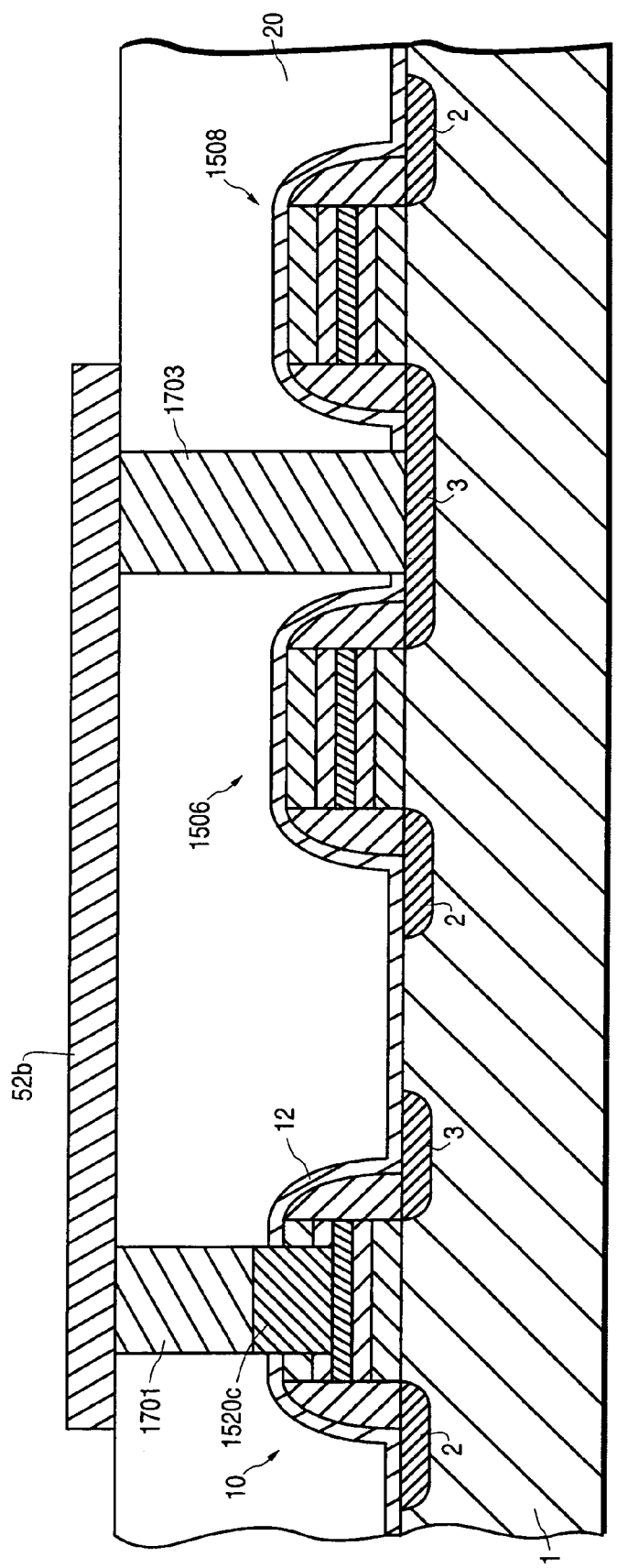
FIG. 18 is a side cross-sectional view of a portion of a memory cell that includes a resistor that electrically couples to the overlying interconnect through a contact that extends above the resistor in accordance with one embodiment of the present invention.

In another embodiment resistors 1520–1521 are formed that only partially fill the opening in pre-metal dielectric layer 20. In the embodiment shown in FIG. 18, a resistor 1520*c* is formed that contacts gate structure 10 and only partially fills the opening in pre-metal dielectric layer 20. Contact 1701 fills the remainder of the opening, contacting resistor 1520*c* on one end and interconnect 52*b* on the other end. Contact 1701 and contact 1703 can be formed of tungsten, titanium or other electrically conductive material. In the present embodiment gate 10 is the common gate structure for transistors 1507 and 1509. Contact 1703 electrically couples interconnect 52*b* to the common drain of transistors 1506 and 1508. An identical structure (not shown) that includes a resistor 1521 that is identical to resistor 1520*c* is used to provide resistance between the common gate of transistors 1506 and 1508 and the drain of transistors 1507 and 1509.

Figure 19:
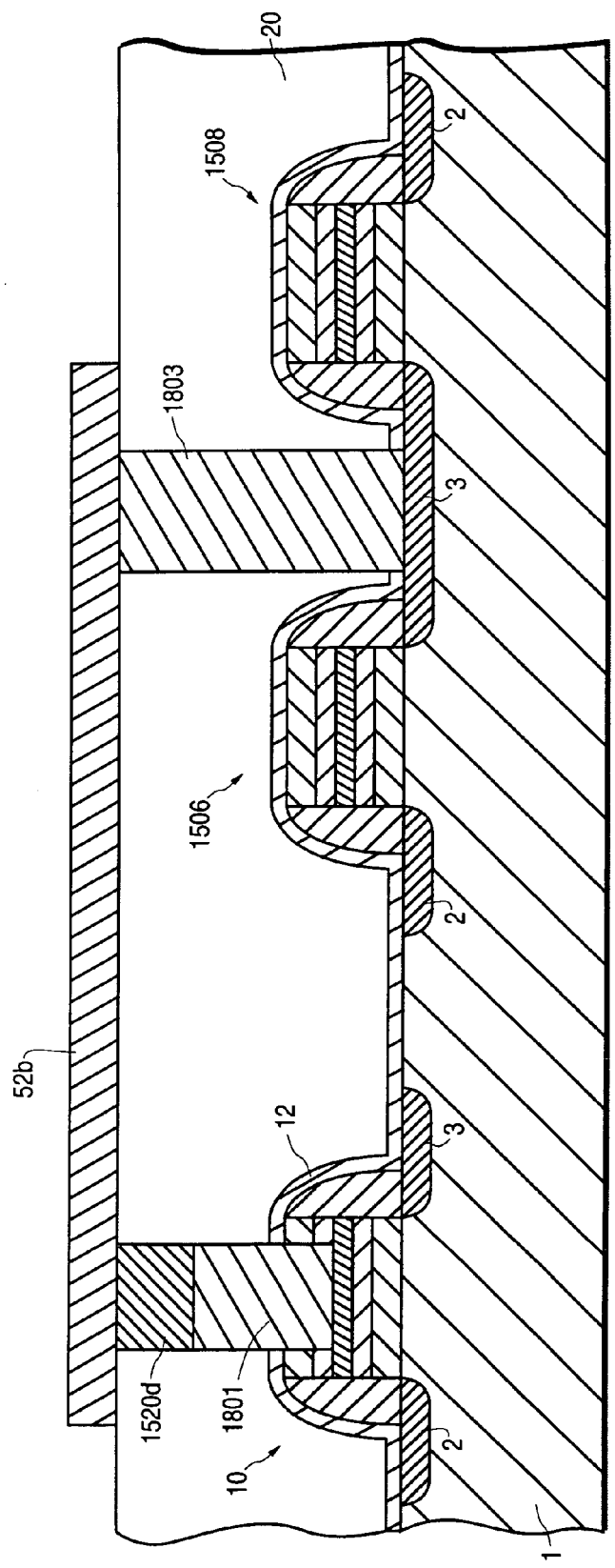
FIG. 19 is a side cross-sectional view of a portion of a memory cell that includes a resistor that electrically couples to the underlying conductive line through a contact that extends below the resistor in accordance with one embodiment of the present invention.

In yet another embodiment resistors 1520–1521 are formed that only partially fill the via in pre-metal dielectric layer 20 and that extend immediately below interconnect 52*b*. In the embodiment shown in FIG. 19, resistor 1520*d* is shown that extends above a contact 1801. Resistor 1520*d* extends between contact 1801 and interconnect 52*b*, contacting interconnect 52*b* on one end and contacting contact 1801 on the other end so as to provide resistance between gate structure 10 and interconnect 52*b*. Contact 1801 and contact 1803 can be formed of tungsten, titanium or other conductive material. In the present embodiment gate 10 is the common gate structure for transistors 1507 and 1509. One end of contact 1803 contacts the common drain of transistors 1506 and 1508, electrically coupling interconnect 52*b* to the common drain of transistors 1506 and 1508. An identical structure (not shown) that includes a resistor 1521 that is identical to resistor 1520*d* is used to provide resistance between the common gate of transistors 1506 and 1508 and the drain of transistors 1507 and 1509.

Though the resistor structures 1520*a*–*d* shown in FIGS. 16–19 are described as forming SRAM memory cells, it is appreciated that the same type of resistor structures could be used to form DRAM memory cells. More particularly, resistor 1405 could be a thin film resistor that includes an upper surface that has the same pattern as interconnect 52 shown in FIG. 12. Alternatively, a separate patterning step could be used to pattern resistor 1405 prior to depositing the first metal layer so as to form a resistor 1405 that is identical to thin film resistor 1520*b* shown in FIG. 17. Also, resistor 1405 could extend above a contact (e.g., resistor 1520*c* of FIG. 18) or could extend below a contact (e.g., resistor 1520*d* of FIG. 19).

As resistors 1520–1521 extend above gate structure 10, the resulting SRAM cell (FIG. 15) does not take up any additional surface area of semiconductor substrate 1 as compared to prior art SRAM cells. Accordingly, the methods and apparatus of the present invention provide SRAM cells having reduced soft error rates that do not take up any additional surface area as compared to prior art SRAM cells.

Though FIGS. 1–12 and 16–18 show specific configurations of resistors that can be used to form DRAM memory cells having reduced soft error rates and SRAM memory cells having reduced soft error rates, it is appreciated that other types and shapes of resistors could also be used.

In one embodiment a Content Addressable Memory (CAM) device is formed that includes SRAM memory cells 1500. The resulting CAM device will have a high soft error tolerance, reducing the likelihood of soft error-related data corruption during operation of the CAM device.

The preferred embodiment of the present invention is thus described. While the present invention has been described in particular embodiments, it should be appreciated that the present invention should not be construed as limited by such embodiments, but rather construed according to the following claims.

What is claimed is:

1. A Static Random Access Memory (SRAM) cell comprising:
    a first NMOS transistor;
    a first PMOS transistor, said first PMOS transistor and said first NMOS transistor including a first common gate;
    a second NMOS transistor;
    a second PMOS transistor, said second PMOS transistor and said second NMOS transistor including a second common gate;
    a first resistor, one end of said first resistor electrically coupled to said drain of said first PMOS transistor and said drain of said first NMOS transistor, and the other end of said first resistor electrically coupled to said second common gate;
    a second resistor, one end of said second resistor electrically coupled to said drain of said second PMOS transistor and said drain of said second NMOS transistor, and the other end of said second resistor electrically coupled to said first common gate;
    a pre-metal dielectric layer that extends over said first and second NMOS transistors, said first and second PMOS transistors and said first and second common gates, an opening extending through said pre-metal dielectric layer;
    a first contact that extends through said pre-metal dielectric layer so as to electrically couple to said drain of said first NMOS transistor and said drain of said first PMOS transistor; and
    a first metal segment that extends over said pre-metal dielectric layer and extends over said first contact such that said first metal segment is electrically coupled to said first contact, said first resistor extending between said second common gate and said first metal segment so as to resistively couple said second common gate to said first metal segment.

2. The SRAM cell of claim 1 wherein said first resistor comprises a first portion that extends within an opening in said pre-metal dielectric layer and that immediately overlies said second common gate, a second portion that overlies said pre-metal dielectric layer, and a third portion that extends vertically between said first portion and said second portion.

3. The SRAM cell of claim 2 wherein said third portion extends along sidewalls of said opening in said pre-metal dielectric layer so as to partially fill said opening in said pre-metal dielectric layer, a dielectric plug filling a remaining portion of said opening in said pre-metal dielectric layer.

4. The SRAM cell of claim 3 wherein said first resistor comprises titanium oxynitride.

5. The SRAM cell of claim 1 further comprising a second metal segment, a second contact and a third contact, said first resistor extending immediately over said second common gate and contacting said second common gate, said second contact extending between said first resistor and said metal segment, said second resistor extending immediately over said first common gate and contacting said first common gate, said third contact extending between said second resistor and said second metal segment.

6. The SRAM cell of claim 1 further comprising a second metal segment, a second contact and a third contact, said first resistor extending immediately below said metal segment and contacting said metal segment, said second contact extending between said first resistor and said second common gate, said second resistor extending immediately below said second metal segment and contacting said second metal segment, said third contact extending between said second resistor and said first common gate.

7. The SRAM cell of claim 1 further comprising:
    a second contact that extends through said pre-metal dielectric layer so as to electrically couple to said drain of said second NMOS transistor and said drain of said second PMOS transistor; and a second metal segment that extends over said pre-metal dielectric layer and extends over said second contact such that said second metal segment is electrically coupled to said second contact, said second resistor extending between said first common gate and said second metal segment so as to resistively couple said first common gate to said second metal segment.

8. The SRAM cell of claim 1 wherein said second resistor comprises a first portion that extends within an opening in said pre-metal dielectric layer and that immediately overlies said first common gate, a second portion that overlies said pre-metal dielectric layer, and a third portion that extends vertically between said first portion and said second portion.

9. A method for forming a Static Random Access Memory (SRAM) cell comprising:

forming a first NMOS transistor on a semiconductor substrate;

forming a first PMOS transistor on said semiconductor substrate, said first PMOS transistor and said first NMOS transistor including a first common gate that electrically couples said first PMOS transistor to said first NMOS transistor;

forming a second NMOS transistor on said semiconductor substrate;

forming a second PMOS transistor on said semiconductor substrate, said second PMOS transistor and said second NMOS transistor including a second common gate that electrically couples said second PMOS transistor to said second NMOS transistor;

forming a pre-metal dielectric layer that extends over said first and second NMOS transistors and said first and second PMOS transistors, a first opening in said pre-metal dielectric layer exposing a portion of said second common gate;

forming a first resistor that extends at least partially within said first opening;

forming a first contact that is electrically coupled to said drain of said first NMOS transistor and said drain of said first PMOS transistor; and forming a first metal segment that extends over said pre-metal dielectric layer, said resistor and said first contact, said first metal segment electrically coupled to said first contact and said first resistor.

10. A method as recited in claim 9 wherein said pre-metal dielectric layer includes a second opening that exposes a portion of said first common gate, said method further including:

forming a second resistor that extends at lease partially within said second opening;

forming a second contact that is electrically coupled to said drain of said second NMOS transistor and said drain of said second PMOS transistor; and forming a second metal segment that extends over said pre-metal dielectric layer, said second resistor and said second contact, said second metal segment electrically coupled to said second contact and said second resistor.

11. A method as recited in claim 10 wherein said first resistor is a thin film resistor having a first portion that immediately overlies said second common gate, a second portion that overlies said pre-metal dielectric layer, and a third portion that extends vertically between said first portion and said second portion.

* * * * *